United States Patent [19]

Yamamoto

[11] Patent Number: 4,920,376

[45] Date of Patent: Apr. 24, 1990

[54] PHOTO-SENSITIVE RECORDING MEDIUM CARTRIDGE FOR USE WITH IMAGE RECORDING APPARATUS

[75] Inventor: Takakuni Sonoda, Nagoya, Japan

[73] Assignee: Brother Kogyo Kabushiki Kaisha, Japan

[21] Appl. No.: 213,350

[22] Filed: Jun. 30, 1988

[30] Foreign Application Priority Data

Jul. 7, 1987 [JP] Japan .......................... 62-104310[U]
Jul. 7, 1987 [JP] Japan .......................... 62-104311[U]
Jul. 17, 1987 [JP] Japan .......................... 62-110375[U]

[51] Int. Cl.$^5$ ............................................. G03B 27/80
[52] U.S. Cl. ......................................... 355/38; 355/40; 355/72
[58] Field of Search ..................... 355/72, 40, 32, 38, 355/100, 64

[56] References Cited

U.S. PATENT DOCUMENTS

| | | | |
|---|---|---|---|
| 3,087,403 | 4/1963 | Herrick | 355/100 |
| 4,283,621 | 8/1981 | Pembroke | 355/64 |
| 4,494,862 | 1/1985 | Tanaka | 355/40 |
| 4,637,712 | 1/1987 | Arnold et al. | 355/64 |
| 4,782,365 | 11/1988 | Takagi | 355/38 |

*Primary Examiner*—Monroe H. Hayes
*Attorney, Agent, or Firm*—Kane, Dalsimer, Sullivan, Kurucz, Levy, Eisele and Richard

[57] ABSTRACT

In a photo-sensitive recording medium cartridge comprising a housing and a photo-sensitive recording medium accommodated therein, information is provided on an outer surface of a peripheral wall of the housing. The information contains data capable of being automatically read out. The data is representative of exposure, developing and fixing conditions of the recording medium. An image recording apparatus comprises a reader unit for reading out the data contained in the information to generate signals respectively indicative of the exposure, developing and fixing conditions, and a control unit operative in response to the signals for controlling an exposure unit, a developing unit and a fixing unit.

8 Claims, 8 Drawing Sheets

PHOTO-SENSITIVE RECORDING MEDIUM CARTRIDGE FOR USE WITH IMAGE RECORDING APPARATUS

BACKGROUND OF THE INVENTION

This invention relates generally to an image recording apparatus, and more particularly, to a photo-sensitive recording medium cartridge for use with the image recording apparatus.

Conventionally, there is known an image recording apparatus which employs a cartridge having accommodated therein a photo-sensitive recording medium. In such image recording apparatus, it is necessary for a user or an operator to manipulate keys on a keyboard, for example, in order to input information on exposure, developing and fixing conditions of the photo-sensitive recording medium, to the image recording apparatus. This inputting operation of the information is extremely difficult and troublesome for the user or operator.

Moreover, a color image recording apparatus is also known, in which three color-decomposed monochromatic mask original plates in a set are successively used to expose the photo-sensitive recording medium to lights from respective light sources, whose wavelengths correspond respectively to the subject colors of the mask original plates, thereby forming three color-decomposed latent images onto the photo-sensitive recording medium. A developing sheet is then superposed upon the exposed photo-sensitive recording medium, to develop a color image in accordance with the three color-decomposed latent images on the photo-sensitive recording medium, onto the developing sheet. Thus, a color image is developed and recorded onto the developing sheet.

In the color image recording apparatus as described above, it is not easy for the human eyes to determine to what colors the mask original plates correspond respectively.

If preparation of the three color-decomposed mask original plates and exposure of the photo-sensitive recording medium are carried out consecutively, the light sources are successively turned on, without occurrence of any error or mistake, in compliance with the order in which the mask original plates are successively superposed upon the photo-sensitive recording medium. That is, if setting of the color image recording apparatus is made such that the light sources are turned on in the order of, for example, red, green and blue, the original-plate preparing apparatus should be so set as to successively output the mask original plates to the color image recording apparatus, in the order of red plate, green plate and blue plate, in compliance with the order in which the light sources are successively turned on.

It is often desired, however, to store the mask original plates once used and taken out of the color image recording apparatus and to again employ the mask original plates to obtain the same color image. In this case, the mask original plates are successively fed into the color image recording apparatus from a manual insertion tray. As mentioned above, however, it is almost impossible for the human eyes to discriminate to which lights with their respective wavelengths in compliance respectively with the mask original plates, the mask original plates should be exposed respectively. Thus, the operation is extremely troublesome, because careful attention is required to be paid to the order in which the mask original plates are correctly fed into the color image recording apparatus.

SUMMARY OF THE INVENTION

It is therefore an object of this invention to provide an improved photo-sensitive recording medium cartridge enabling information on exposure, developing and fixing conditions of a photo-sensitive recording medium to be automatically read out.

It is another object of the invention to provide an improved image recording apparatus capable of automatically reading out information on exposure, developing and fixing conditions of a photo-sensitive recording medium accommodated in a cartridge.

It is still another object of the invention to provide an improved color image recording apparatus capable of automatically exposing a photo-sensitive recording medium successively to lights with their respective wavelengths in compliance respectively with mask original plates in a set which are successively superposed upon the photo-sensitive recording medium.

For the above purpose, according to the invention, there is provided a photo-sensitive recording medium cartridge, which comprises:

a housing having a peripheral wall;

a photo-sensitive recording medium accommodated in the housing;

information means provided on an outer surface of the peripheral wall of the housing, the information means containing data capable of being automatically read out, the data being representative of at least one of exposure, developing and fixing conditions of he photo-sensitive recording medium.

According to the invention, there is also provided an image recording apparatus which comprises:

an apparatus body;

a photo-sensitive recording medium cartridge removably loaded on the apparatus body, the cartridge including a housing having a peripheral wall and a photo-sensitive recording medium accommodated in the housing;

information means associated with the cartridge, the information means containing data representative of at least one of exposure, developing and fixing conditions of the photo-sensitive recording medium;

exposure means arranged within the apparatus body for exposing the photo-sensitive recording medium drawn out of the housing of the cartridge;

developing means arranged within the apparatus body for developing the exposed image;

fixing means arranged within the apparatus body for fixing the developed image;

reader means for reading out the data contained in the information means to generate a signal indicative of at least one of the exposure, developing and fixing conditions; and control means operative in response to the signals from the reader means for controlling at least one of the exposure means, the developing means and the fixing means.

According to the invention, there is further provided a color image recording apparatus utilizing a photo-sensitive recording medium and a set of a plurality of color-decomposed mask original plates, each mask original plate being provided with image information containing data as to what color the mask original plate corresponds, which comprises:

reader means for successively reading out the data contained in the image information provided respectively on the mask original plates, to generate signals indicative of the respective data;

the mask original plates being successively superposed upon the photo-sensitive recording medium;

exposure means operative in response to the signals from the reader means for exposing the photo-sensitive recording medium successively to lights with their respective wavelengths in conformity respectively with the mask original plates which are successively superposed upon the photo-sensitive recording medium, thereby forming color-decomposed latent images corresponding to the respective mask original plates, onto the photo-sensitive recording medium; and developing means for developing a color image in accordance with the color-decomposed latent images.

BRIEF DESCRIPTION OF THE ACCOMPANYING DRAWINGS

DESCRIPTION OF THE EMBODIMENT

Figure 1:
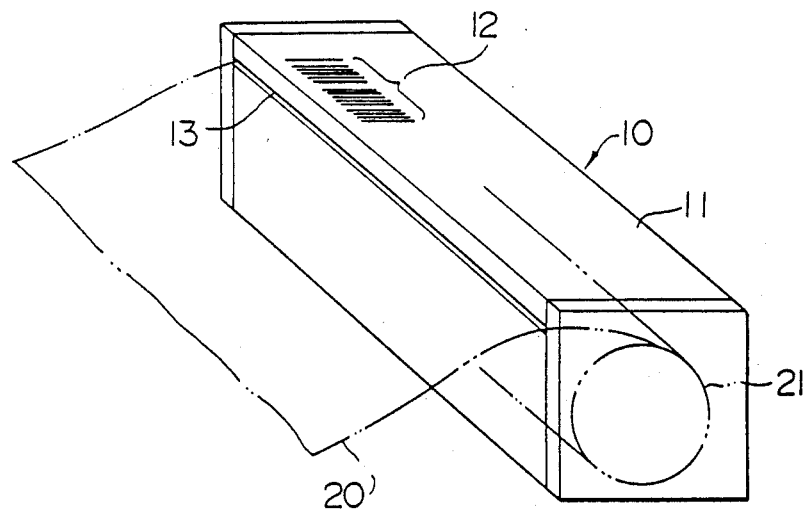
FIG. 1 is a perspective view of a photo-sensitive recording medium cartridge embodying the invention.
Figure 2:
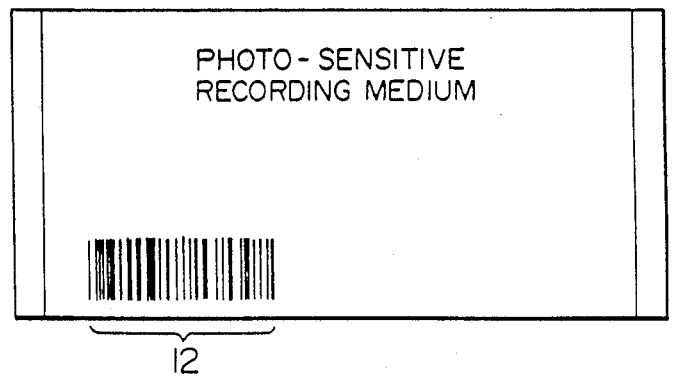
FIG. 2 is a top plan view of the cartridge illustrated in FIG. 1.

Referring to FIGS. 1 and 2, there is shown a photosensitive recording medium cartridge 10 embodying the invention. The cartridge 10 comprises a substantially closed housing 11 having a peripheral wall and a pair of end walls. The peripheral wall has a generally rectangular cross-sectional shape so that the peripheral wall is composed of four side walls. A continuous roll 21 of photo-sensitive recording web 20 is accommodated in the housing 11. The housing 11 is provided therein with a longitudinal opening 13 through which the photo-sensitive recording web 20 can be drawn out of the housing 11.

Information 12 is provided on an outer surface of one of the four side walls of the housing 11. The information 12 contains data in the form of a bar code capable of being read out by a reader unit incorporated in an image recording apparatus subsequently to be described. In the illustrated embodiment, the bar code is printed on the outer surface of the side wall of the housing 11. The bar code is representative of exposure, developing and fixing conditions of the photo-sensitive recording web 20.

It is to be understood that the information 12 is not limited to the bar code, but may be a magnetic tape, punched holes or any other suitable information means. Further, it is of course that a piece of paper having printed thereon the information 12 may be stuck on the outer surface of the housing 11.

The image recording apparatus for use with the cartridge 10 constructed as above will be described below with reference to FIG. 3.

Figure 3:
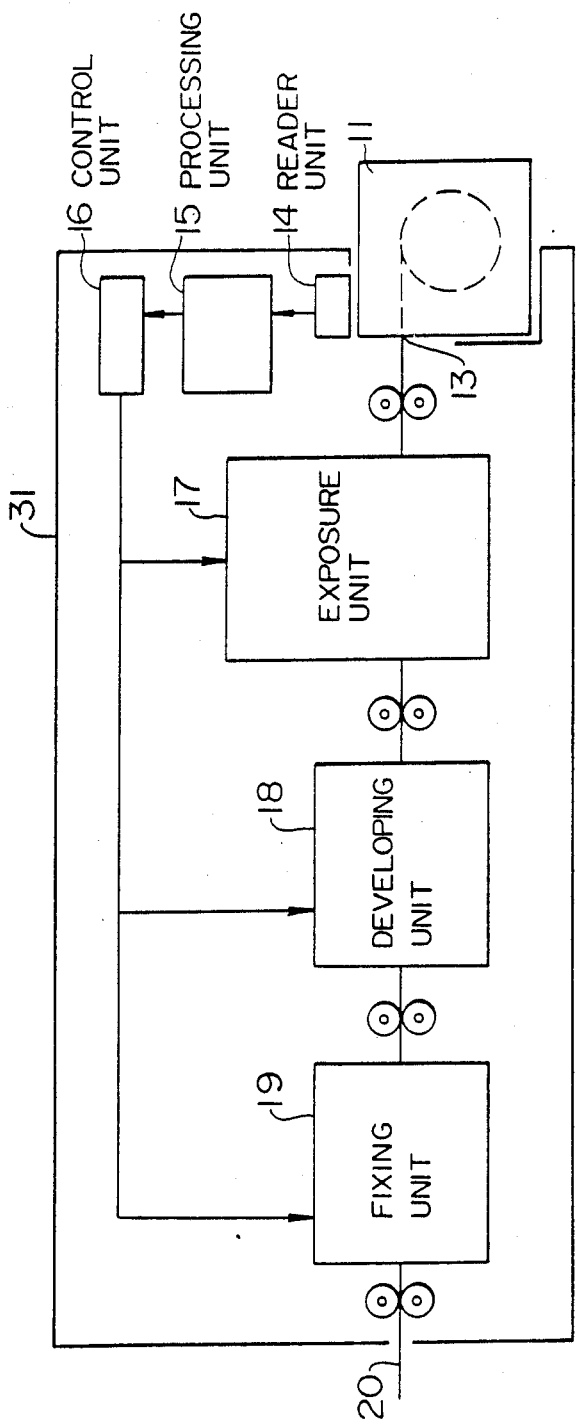
FIG. 3 is a diagrammatic view of an image recording apparatus employing the cartridge illustrated in FIG. 1.

As shown in FIG. 3, the photo-sensitive recording medium cartridge 11 is removably loaded on an apparatus body 31 of the image recording apparatus. A reader unit 14 is arranged within the apparatus body 31 and is located in facing relation to the information 12 on the housing 11 of the cartridge 10 having been loaded on the apparatus body 31, for reading out the information 12. The reader unit 14 may be of optical reading type, magnetic reading type or any other suitable reading type, provided that the reader unit 14 is coincident with the manner of recording of the information 12.

The read-out information 12 is transferred to a processing unit 15 where the read-out information 12 is decoded and is converted into control information. The control information is then transferred to a control unit 16. On the basis of the control information, the control unit 16 controls an exposure unit 17, a developing unit 18 and a fixing unit 19. Specifically, on the basis of the control information, the control unit 16 sets conditions of initial process parameters of various mechanisms. The mechanisms include a light-quantity adjusting mechanism, an exposure time setting mechanism and a temperature and moisture adjusting mechanism (all not shown) of the exposure unit 17, a temperature and moisture adjusting mechanism and a pressurizing mechanism (both not shown) of the developing unit 18, and a temperature and moisture adjusting mechanism and a pressurizing mechanism (both not shown) of the fixing unit 19.

As described above, the information 12 provided on the outer surface of the housing 11 of the photo-sensitive recording medium cartridge 10 illustrated in FIGS. 1 and 2 enables the exposure, developing and fixing conditions of the photo-sensitive recording web 20 to be automatically inputted to the image recording apparatus. This extremely facilitates the operation of the image recording apparatus, and makes it possible to prevent erroneous operation such as an inputting error or mistake.

Figure 4:
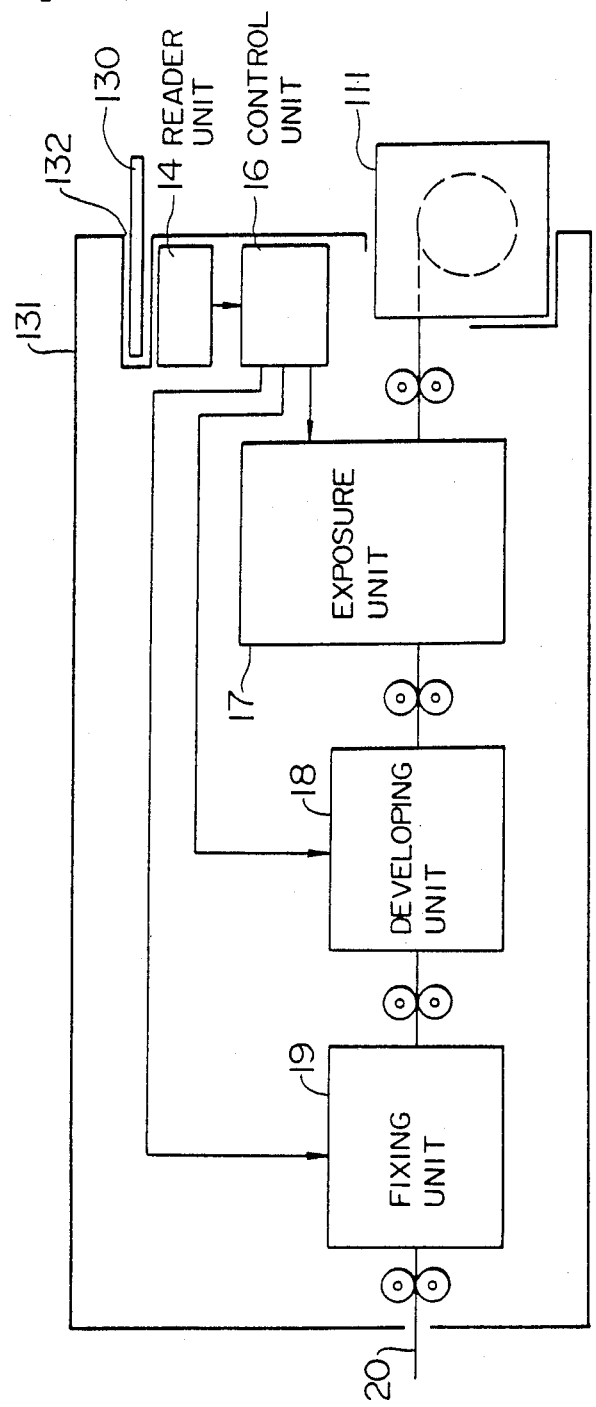
FIG. 4 is a diagrammatic view of an image recording apparatus embodying the invention, which employs an external information card associated with a photo-sensitive recording medium cartridge.

Referring next to FIG. 4, there is shown an image recording apparatus embodying the invention, which is generally similar to that shown in FIG. 3. In FIG. 4, component parts like or similar to those illustrated in FIG. 3 are designated by the same or like reference numerals.

Figure 5:
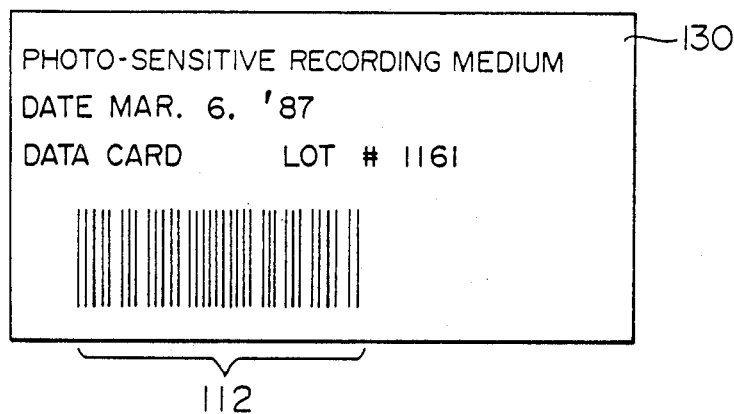
FIG. 5 is a plan view of the external information card illustrated in FIG. 4.

As shown in FIG. 4, a photo-sensitive recording medium cartridge 110 is removably loaded on an apparatus body 131 of the image recording apparatus. The cartridge 110 is similar in construction to the cartridge 10 illustrated in FIG. 3, but is different therefrom in that no information is printed on the outer surface of the housing. Instead, an external information recording card 130 is employed, which is independent of the cartridge 110. As shown in FIG. 5, the card 130 has printed thereon information 112 in the form of a bar code. The card 130 is initially affixed to the housing of the cartridge 110 and, in use, is removed or separated from the housing of the cartridge 110.

The image recording apparatus shown in FIG. 4 is similar to that illustrated in FIG. 3, but the apparatus body 131 is provided therein with an insertion opening 132 serving as receptacle means for receiving the card 130. The reader unit 14 is located adjacent the insertion opening 132.

The operation of the image recording apparatus shown in FIG. 4 is substantially same as for the apparatus of FIG. 3.

The information 112 is not limited to the bar code, but may be a magnetic tape, punched holes or any other suitable information means. Further, in place of the card 130, it is possible to use a magnetic tape or any other suitable means capable of being read out by the reader unit 14.

Figure 6:
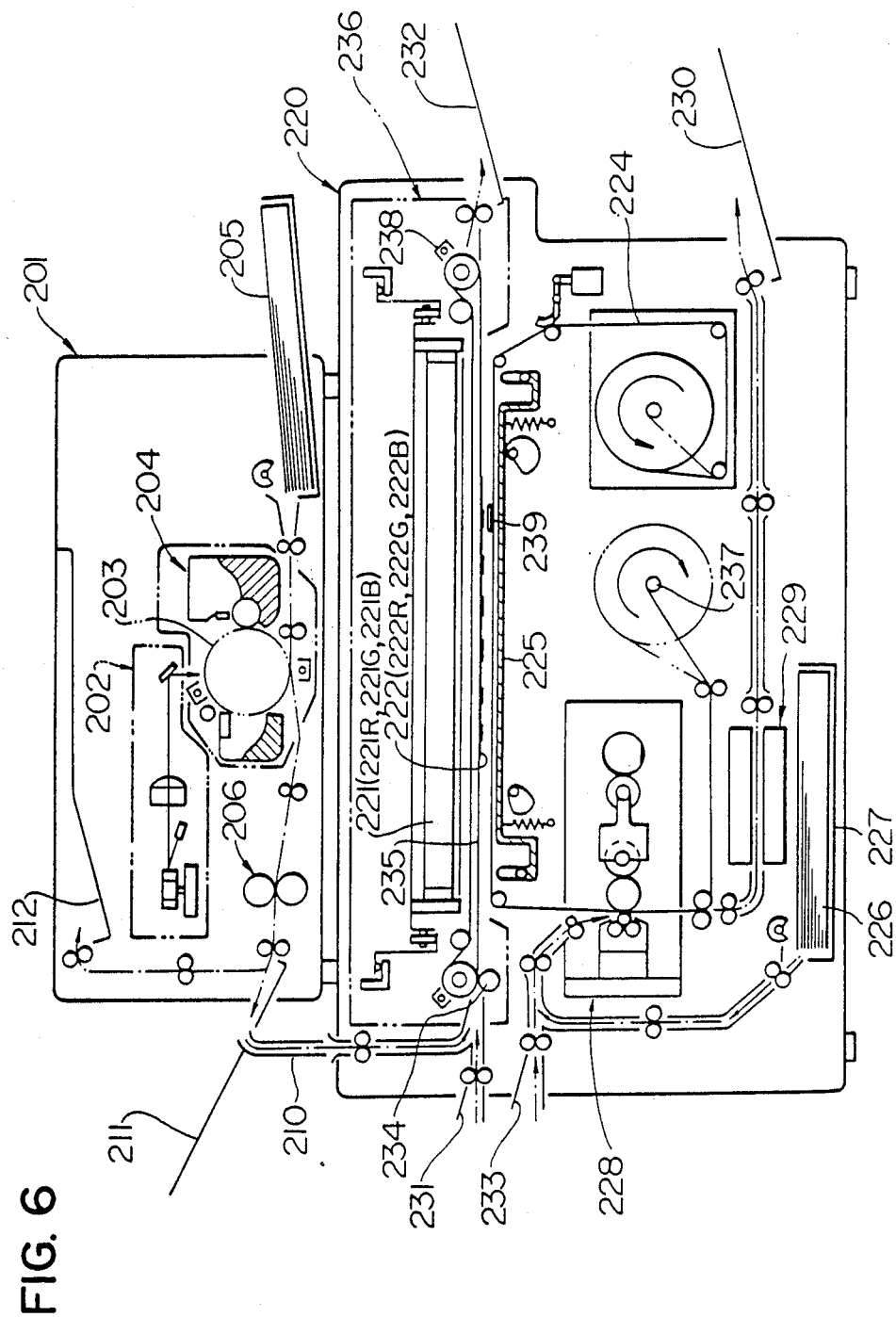
FIG. 6 is a vertically cross-sectional schematic view of a color image recording apparatus embodying the invention.

Referring to FIG. 6, there is shown a combination of a monochromatic laser printer 201 and a color image recording apparatus 220 embodying the invention. The monochromatic laser printer 201 is mounted on the top of the color image recording apparatus 220.

The monochromatic laser printer 201 is of conventionally known type in which a beam scanning unit 202 directs a laser beam to a charged surface of a photoconductive drum 203 to form a latent image on the charged surface. The latent image on the drum 203 is then developed by a developing unit 204. The developed image is transferred to a common sheet of paper or an OHP (Over Head Projector) sheet fed from a sheet feed cassette 205. The transferred image on the sheet is fixed by a fixing unit 206. Usually, the monochromatic laser printer 201 is designed to record data transmitted from a host computer, and to feed a sheet having fixed thereto a monochromatic image, to a selected one of a pair of monochromatic sheet discharge trays 211 and 212. In the illustrated embodiment, the laser beam printer 201 is so arranged as to prepare a set of a mask original plate 222R for red, a mask original plate 222G for green and a mask original plate 222B for blue, which are employed in the color image recording apparatus 220, subsequently to be described. Each of such mask original plates 222 will hereinafter be referred also to as "intermediate sheet".

The color image recording apparatus 220 embodying the invention is so arranged as to utilize a set of mask original plates prepared in accordance with color image information, to record a color image.

The color image recording apparatus 220 comprises a path switching mechanism 210 for switching a transport path so as to transport the mask original plates 222R, 222G and 222B on the discharge tray 211 to an exposure unit 236 of the color image recording apparatus 220. A vertically movable exposure platen 225 is arranged at the exposure unit 236 for bringing the intermediate sheet 222 into close contact with a portion of a continuous photo and pressure sensitive recording web 224 unwound from a roll. The recording web 224 has one side thereof coated with capsules containing dye precursors. The exposure unit 236 comprises three exposure light sources 221 for three primary colors, which are arranged above the exposure platen 225. The exposure light sources 221 include a light source 221R for red, a light source 221G for green and a light source 221B for blue. A developing sheet cassette 227 is arranged at a lower position within a casing of the color image recording apparatus 220. The developing sheet cassette 227 accommodates therein a stack of cut developing sheets 226 each coated with a developer which reacts with the dye precursors in the capsules coated on the sensitive recording web 224, to develop the color. Above the developing sheet cassette 227, a pressurizing and developing unit 228 is arranged for pressurizing the portion of the recording web 224 and the developing sheet 226 superposed one upon the other, to develop a color image in accordance with the three color-decomposed latent images on the portion of the recording web 224, onto the developing sheet 226. A heat-fixing unit 229 is arranged at a location between the developing sheet feed cassette 227 and the pressurizing and developing unit 228, for promoting the color-developing reaction between the developer on the developing sheet 226 and the dye precursors contained in the capsules on the recording web 224, thereby heat-fixing the color image on the developing sheet 226. The developing sheet 226 having carried thereon the developed color image is discharged onto a discharge tray 230.

The color image recording apparatus 220 further comprises a manual insertion tray 231 for manually inserting successively the intermediate sheets 222 from the outside, a discharge tray 232 onto which the intermediate sheets 222 after exposure are successively discharged, and a manual insertion tray 233 for manually inserting developing sheets.

In a color mode, the mask original plate 222R for red, for example, prepared by the monochromatic laser printer 201 is caused to pass through the path switching mechanism 210, and a leading edge of the mask original plate 222R is positioned by a positioning roller 234. The mask original plate 222R is electrostatically attracted against an endless belt 235 serving as intermediate sheet transport means. The endless belt 235 is formed of an electric insulation material such as, for example, PET (polyethylene terephthalate), and is run around a pair of rollers. A pair of corona generators 238 such as, for example, a corotron are arranged respectively adjacent the pair of rollers, for applying static electricity to the endless belt 235 to enable the same to attract the mask original plate 222R under electrostatic force. In this manner, the mask original plate 222R is transported by the endless belt 235 into the exposure unit 236.

The mask original plate 222R is positioned correctly by movement of the endless belt 235 such that relative displacement does not occur among the three color-decomposed latent images on the portion of the photo and pressure sensitive recording web 224. At the exposure unit 236, the exposure platen 225 is moved upwardly to bring the portion of the recording web 224 into close contact with the mask original plate 222R for red. Subsequently, the light source 221R is turned on to expose the portion of the recording web 224 to a light with a wavelength through the mask original plate 222R for red. Thus, a latent image corresponding to the mask original plate 222R is formed onto the portion of the recording web 224. After exposure, the mask original plate 222R is discharged onto the discharge tray 232. Likewise, the remaining two mask original plates 222G and 222B for green and blue are successively brought to the position at the exposure unit 236, and the light sources 221G and 221B are successively turned on to expose the portion of the recording web 224 to lights having their respective wavelengths through the mask original plates 222G and 222B. Thus, three color-decomposed latent images are formed onto the portion of the recording web 224.

The developing sheet 226 is fed from the developing sheet cassette 227, and is caused to pass through the pressurizing and developing unit 228, while being superposed upon the portion of the recording web 224 having carried thereon the color-decomposed latent images. The pressurizing and developing unit 228 pressurizes the developing sheet 226 and the portion of the recording web 224 superposed one upon the other to develop a color image in accordance with the three color-decomposed latent images on the portion of the recording web 224, onto the developing sheet 226. Thereafter, the developing sheet 226 having carried thereon the color image is caused to pass through the heat-fixing unit 229 so that the color image on the developing sheet 226 is heat-fixed. The developing sheet 226 having carried thereon the fixed color image is discharged onto the discharge tray 230. On the other hand, the portion of the recording web 224 after having passed through the pressurizing and developing unit 228 is taken up around a take-up roller 237.

Figure 7:
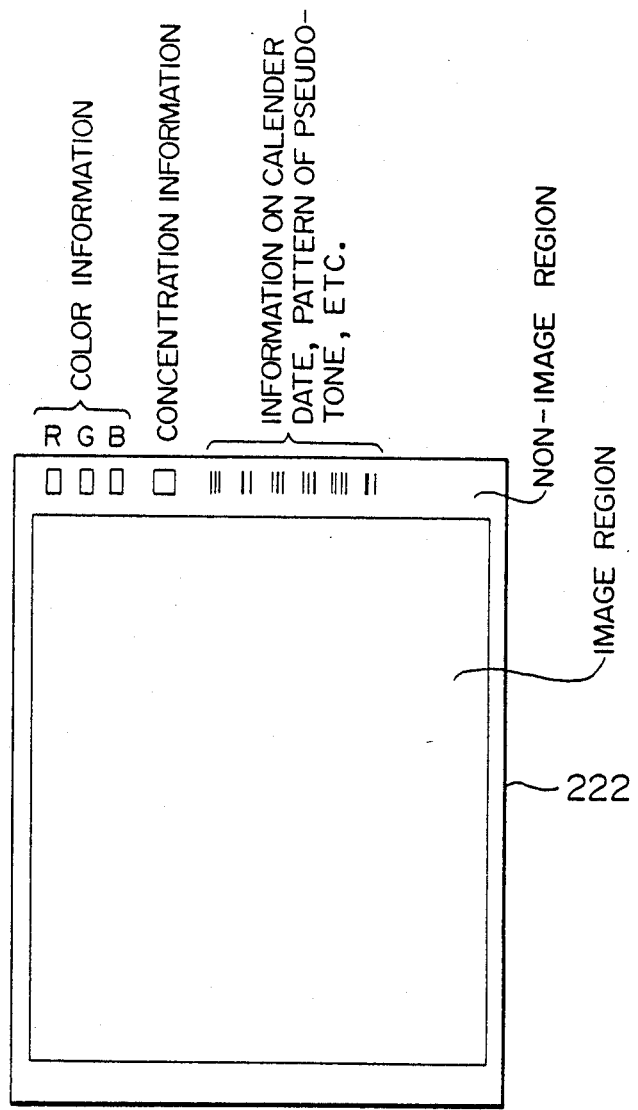
FIG. 7 is a front view of one of three color-decomposed mask original plates employed in the color image recording apparatus illustrated in FIG. 6, the mask original plate having carried thereon information containing various data.

FIG. 7 is a plan view of the mask original plate 222 to which color information is written by the monochromatic laser printer 201. In the illustrated embodiment, a difference in position where a mark is written makes it possible to discriminate a difference among the mask original plate 222R for red, the mask original plate 222G for green and the mask original plate 222B for blue. In addition to the color information, the mask original plate 222 has written thereto information containing various data on an image concentration of the mask original plate 222, a calendar date on which the mask original plate 222 is prepared, a pattern of a pseudo-tone, a machine type by which the mask original plate 222 is prepared, and the like.

In the embodiment illustrated in FIG. 6, if it is desired to utilize the mask original plates 222 once used and stored outside of the color image recording apparatus 220, to obtain a color image, the mask original plates 222 are inserted into the color image recording apparatus 220 from the manual insertion tray 231, without the use of the monochromatic laser printer 201. In this case, each time the mask original plates 222 are successively transported into the exposure unit 236 by the endless belt 235, a reader unit 239 reads out the image information written respectively to the mask original plates 222. Specifically, a reflective-optical sensor or the like incorporated in the reader unit 239 reads out to what color the mask original plate 222 transported into the exposure unit 236 corresponds, to generate a signal for selecting one of the light sources 221 whose wavelength corresponds to the mask original plate 222 inserted from the manual insertion tray 231. The exposure unit 236 successively receives the signals from the reader unit 239, and successively and selectively turns on the light sources 221R, 221G and 221B corresponding respectively to the mask original plates 222R, 222G and 222B, thereby forming three color-decomposed latent images corresponding respectively to the mask original plates, onto a portion of the photo and pressure sensitive recording web 224 which is brought to the position at the exposure unit 236. After the portion of the recording web 224 is exposed successively through the three mask original plates 222, a color image is formed onto a developing sheet 226 fed from the developing sheet feed cassette 227, in a manner similar to that described previously. Not only the color information (R, G, B), a transmissive-type optical sensor or the like incorporated in the reader unit 239 also reads out successively information on the image concentrations of the respective mask original plates 222R, 222G and 222B, to generate signals representative of the respective image concentrations.

The exposure unit 236 is operative in response to the signals from the transmissive-type optical sensor, to determine adequate exposure amounts to the portion of the recording web 224 with respect to the respective mask original plates, thereby adjusting periods of time for exposure. Alternatively or additionally, the exposure unit 236 is operative in response to the signals from the transmissive-type optical sensor, to adjust light quantities from the respective light sources 221R, 221G and 221B.

Figure 8:
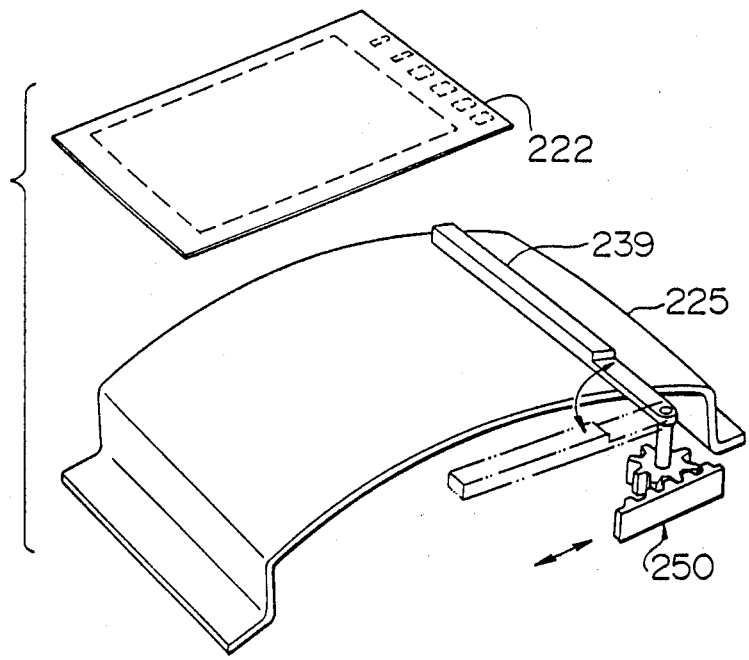
FIG. 8 is a perspective view showing the positional relationship between an image information reader unit and an exposure platen illustrated in FIG. 6.

FIG. 8 shows the positional relationship among the reader unit 239, the exposure platen 225 and the mask original plate 222. The reader unit 239 is obstructive of successive exposure of the portion of the photo and pressure recording web 224 to the lights from the respective light sources 221, because the mask original plate 222 and the portion of the recording web 224 must be brought into close contact with each other. To this end, a rack and pinion mechanism 250 is associated with the reader unit 239 to angularly move the same between an operative position indicated by the solid lines in FIG. 8 and an inoperative position indicated by the double-dotted lines, about a vertically extending pivot axis. In the operative position, the reader unit 239 faces toward the information on the mask original plate 222 when it reaches a position where the portion of the recording web 224 upon which the mask original plate 222 is superposed, is exposed to the light from the light source 221 corresponding to the mask original plate 222. After having read out the information on the mask original plate 222, the reader unit 239 is moved to the inoperative position where the reader unit 239 is located exteriorly of the exposure platen 225 and in parallel to the adjacent side edge of the exposure platen 225. In the inoperative position, accordingly, the reader unit 239 does not interfere with successive exposure of the portion of the recording web 224 to the lights from the respective light sources 221.

Figure 9:
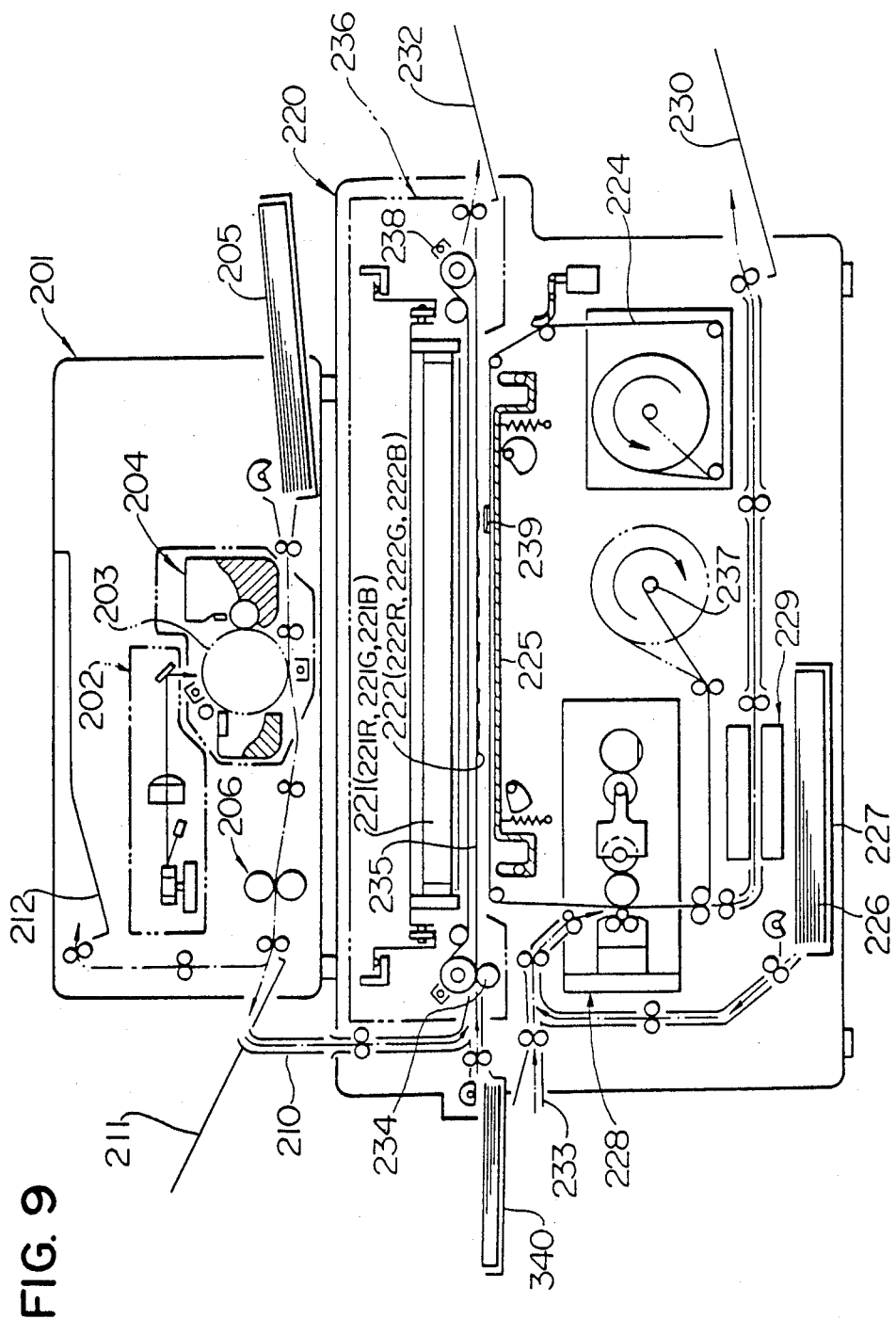
FIG. 9 is a view similar to FIG. 6, but showing a modified color image recording apparatus.

FIG. 9 shows a modified color image recording apparatus which is similar to that illustrated in FIG. 6, but is different therefrom in that an automatic sheet feed cassette 340 for the mask original plates 222 is arranged in substitution for the manual insertion tray 231 shown in FIG. 6. When it is desired to record various kinds of color images, a stack of a plurality of sets of mask original plates 222 is accommodated in the sheet feed cassette 340. The mask plates 222 in each set are automatically fed successively one by one from the sheet feed cassette 340 into the exposure unit 236.

In the embodiment and the modification illustrated respectively in FIGS. 6 and 9, the monochromatic printer 201 is not particularly limited to the laser beam printer, but may be an LED (light emitting diode) printer, a liquid-crystal printer, a thermal-transfer printer or any other suitable printer, provided that such printer can prepare three color-decomposed original documents for R, G and B. In case of a printer of desktop type, the printer is mounted on the top of the color image recording apparatus 220 and is operatively connected thereto. On the other hand, in case of a large-size printer, three color-decomposed original documents prepared by the large-size printer are inserted into the color image recording apparatus 220 from the manual insertion tray 231 shown in FIG. 6. Thus, it is possible for the color image recording apparatus to easily obtain color images.

As described above, the arrangement of each of the color image recording apparatuses illustrated respectively in FIGS. 6 and 9 is such that when it is desired to take a hard copy having carried thereon a color image from the mask original plates, the reader unit reads out the information provided respectively on the mask original plates, and the photo-sensitive recording medium is exposed successively to the lights with their respective wavelengths in conformity respectively with the subject colors of the mask original plates. With such arrangement, an operator can operate the color image recording apparatus without directing any attention to the order in which the mask original plates are successively fed to the exposure unit, making it possible to obtain color images easily without occurrence of an error or mistake. Further, the arrangement of the color image recording apparatus illustrated in FIG. 9 is such that if it is desired to obtain various kinds of color images, a plurality of sets of mask original plates are set in the automatic sheet feed cassette so that the mask original plates in each set are successively fed to the exposure unit from the sheet feed cassette. With such arrangement, it is possible to set the mask original plates without directing any attention to the order of the mask original plates for red, green and blue. Thus, the operation can be made simple and easy.

What is claimed is:

1. A color image recording apparatus utilizing a photo-sensitive recording medium and a set of a plurality of color-decomposed mask original plates, each mask original plate being provided with image information containing data as to what color the mask original plate corresponds, which comprises:
    reader means for successively reading out the data contained in the image information provided respectively, on said mask original plates, to generate signals indicative of the respective data;
    said mask original plates being successively superposed upon said photo-sensitive recording medium;
    exposure means operative in response to said signals from said reader means for exposing said photo-sensitive recording medium successively to lights with their respective wavelengths in conformity respectively with said mask original plates which are successively superposed upon said photo-sensitive recording medium, thereby forming color-decomposed latent images corresponding to the respective mask original plates, onto said photo-sensitive recording medium; and
    developing means for developing a color image in accordance with said color-decomposed latent images.

2. The color image recording apparatus according to claim 1, wherein said reader means further reads out successively second data contained in the image information provided respectively on said mask original plates, to generate second signals representative of the respective second data, said second data being respectively indicative of concentrations of the respective color mask original plates, said exposure means being operative in response to said second signals from said reader means, to adjust periods of time for exposure.

3. The color image recording apparatus according to claim 1, wherein said exposure means includes a plurality of light sources corresponding in number to said mask original plates in the set, and wherein said reader means further reads out successively second data contained in the image information provided respectively on said mask original plates, to generate second signals representative of the respective second data, said second data being respectively indicative of concentrations of the respective mask original plates, said exposure means being operative in response to said second signals from said reader means, to adjust light quantities from the respective light sources.

4. The color image recording apparatus according to claim 1, wherein said reader means is movable between an operative position where said reader means faces toward the information on each of said mask original plates when the mask original plate reaches a position where said photo-sensitive recording medium upon which the mask original plate is superposed is exposed to one of said lights corresponding to the mask original plate, and an inoperative position where said reader means does not interfere with exposure of said photo-sensitive recording medium by said exposure means.

5. The color image recording apparatus according to claim 1, further comprising transport means for successively attracting said mask original plates to feed the same to a position where said photo-sensitive recording medium is exposed by said exposure means, and electrostatic means for applying static electricity to said transport means thereby enabling the same to successively attract said mask original plates under electrostatic force.

6. The color image recording apparatus according to claim 5, wherein said transport means is in the form of an endless belt.

7. The color image recording apparatus according to claim 1, further comprising a sheet feed cassette having accommodated therein a stack of a plurality of sets of mask original plates, said mask original plates in each set being successively fed one by one from said sheet feed cassette toward a position where said photo-sensitive recording medium is exposed by said exposure means, successively through said mask original plates.

8. The color image recording apparatus according to claim 1, wherein said photo-sensitive recording medium is in the form of a continuous roll of photo-sensitive recording web, and wherein said color image recording apparatus further comprises a sheet feed cassette in which a stack of a plurality of cut developing sheets are accommodated, the cut developing sheets being fed one by one from said sheet feed cassette to a position where the developing sheet is developed by said developing means.

* * * * *